United States Patent
Langhammer

(10) Patent No.: US 10,872,130 B2
(45) Date of Patent: Dec. 22, 2020

(54) HIGH PERFORMANCE QR DECOMPOSITION SYSTEMS AND METHODS

(71) Applicant: Intel Corporation, Santa Clara, CA (US)

(72) Inventor: Martin Langhammer, Alderbury (GB)

(73) Assignee: Intel Corporation, Santa Clara, CA (US)

( * ) Notice: Subject to any disclaimer, the term of this patent is extended or adjusted under 35 U.S.C. 154(b) by 362 days.

(21) Appl. No.: 15/692,659

(22) Filed: Aug. 31, 2017

(65) Prior Publication Data

US 2018/0285318 A1 Oct. 4, 2018

Related U.S. Application Data

(60) Provisional application No. 62/481,504, filed on Apr. 4, 2017.

(51) Int. Cl.
*G06F 17/16* (2006.01)
*G06F 7/50* (2006.01)
*H03K 19/17704* (2020.01)
*H03K 19/173* (2006.01)

(52) U.S. Cl.
CPC .............. *G06F 17/16* (2013.01); *G06F 7/50* (2013.01); *H03K 19/1733* (2013.01); *H03K 19/17704* (2013.01)

(58) Field of Classification Search
CPC ................................................. G06F 17/16
See application file for complete search history.

(56) References Cited

U.S. PATENT DOCUMENTS

| 8,539,016 B1 * | 9/2013 | Langhammer | G06F 17/16 708/520 |
| 8,812,576 B1 * | 8/2014 | Mauer | G06F 17/16 708/520 |

OTHER PUBLICATIONS

G.H. Golub, et al, Matrix Computations (3rd Ed.). Baltimore, MD, USA: John Hopkins University Press, 1996.
M. Karkooti, et al, "FPGA implementation of matrix inversion using QRD-RLS algorithm," in Conference Record of the Thirty-Ninth Asilomar Conference onSignals, Systems, and Computers, 2005., Oct. 2005, pp. 1625-1629.
V. Mauer, et al, "Floating point STAP implementation on FPGAs," in 2011 IEEE RadarCon (RADAR), May 2011, pp. 901-904.
M. Parker, et al, "Qr decomposition using fpgas," in 2016 IEEE National Aerospace and Electronics Conference (NAECON) and Ohio Innovation Summit (OIS), Jul. 2016, pp. 416-421.
(Continued)

*Primary Examiner* — Chuong D Ngo
(74) *Attorney, Agent, or Firm* — Fletcher Yoder, PC

(57) ABSTRACT

Based on a Modified Gram-Schmidt (MGS) algorithm, QR decomposition techniques are optimized for parallel structures that provide arithmetic-logic unit (ALU) to ALU connectivity. The techniques utilize a different loop organization, but the dependent functional sequences of the algorithm are unchanged, thereby reducing likelihood of affecting error analysis and/or numerical stability. Some integrated circuit devices (e.g., FPGA) may implement hard floating-point (HFP) circuitry, such as a digital signal processing (DSP) block, distributed memories, and/or flexible internal connectivity, which can support the discussed high performance matrix arithmetic.

20 Claims, 3 Drawing Sheets

(56) References Cited

OTHER PUBLICATIONS

M. Langhammer, "Floating point datapath synthesis for FPGAs," in Field Programmable Logic and Applications, Sep. 2008, pp. 355-360.

M. Langhammer, et al, "FPGA floating point datapath compiler," Field-Programmable Custom Computing Machines, Annual IEEE Symposium on, vol. 17, pp. 259-262, 2009.

M. Langhammer, et al, "Floating-point DSP block architecture for FPGAs," in Proceedings of the 2015 ACM/SIGDA International Symposium on Field-Programmable Gate Arrays, ser. FPGA '15. New York, NY, USA: ACM, 2015, pp. 117-125. [Online]. Available: http://doi.acm.org/10.1145/2684746.2689071.

"DSP Builder Advanced Blockset," https://www.altera.com/products/design-software/model-simulation/dsp-builder/overview.html. Accessed Nov. 21, 2016.

\* cited by examiner

HIGH PERFORMANCE QR DECOMPOSITION SYSTEMS AND METHODS

CROSS REFERENCE TO RELATED APPLICATIONS

This application is a Continuation of Provisional Patent Application No. 62/481,504, filed Apr. 4, 2017, entitled "High Performance QR Decomposition Systems and Methods," which is herein incorporated by reference.

BACKGROUND

The present disclosure generally relates to integrated circuit devices and, more particularly, to implementing QR decomposition (QRD) in an integrated circuit device.

Generally, QR decomposition (e.g., factorization) techniques are implemented to decompose a typically n×n matrix into an orthogonal matrix Q and a right triangular matrix R. QR decomposition may be used, for example, to solve the linear least squares problem. Accordingly, QR decomposition is often utilized in many applications, such as wireless applications and/or radar applications. However, data dependencies and/or data access patterns have traditionally limited the achievable performance in software programmable targets.

Moreover, implementing QR decomposition in an integrated circuit device may consume significant memory and/or processing resources. For example, a typical QRD size may operate on a 256×256 complex matrix. When 64 matrix elements are operated on per clock cycle (e.g., to balance resources and/or throughput), 4 Mb of memory may be used to store the main Q matrix and 256 processing blocks (e.g., circuitry) may be used to implement the main datapaths. Additionally, 2 Mb of memory may be used to store the R matrix result storage and further processing blocks may be implemented to perform a division operation and an inverse square root operation. Furthermore, to enable loading and unloading the matrix at the same time as processing, additional memory may be implemented to store the Q matrix storage.

SUMMARY

Some integrated circuit devices (e.g., FPGA) may implement hard floating-point (HFP) circuitry, such as a digital signal processing (DSP) block, distributed memories, and/or flexible internal connectivity, which can support high performance matrix arithmetic. The present disclosure provides QR decomposition techniques optimized for parallel structures that provide arithmetic-logic unit (ALU) to ALU connectivity. Based on a Modified Gram-Schmidt (MGS) algorithm, the techniques utilize a different loop organization, but the dependent functional sequences are unchanged, thereby reducing likelihood of affecting error analysis and/or numerical stability. In particular, despite the latencies associated with some of the parallel vector approaches, data dependencies are largely hidden in the organization of different types of operations. Moreover, the techniques may enable a theoretical ratio of sustained performance to peak performance close to 100% for large matrices.

In fact, the disclosed techniques may provide roughly twice the functional density of other conventional QR decomposition techniques. In other words, the disclosed techniques may provide approximately twice the throughput of the other conventional QR decomposition techniques. For example, implementing the disclosed techniques in a real world application, a 256×256 single precision real matrix may be QR decomposed in approximately 80 μs (e.g., 417 GFlops), which corresponds to a 95% ratio of sustained performance to peak performance.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in further detail below, embodiments of the present disclosure relate generally to QR decomposition techniques optimized for parallel structures that provide arithmetic-logic unit (ALU) to ALU connectivity. Based on a Modified Gram-Schmidt (MGS) algorithm, the techniques utilize a different loop organization, but the dependent functional sequences are unchanged, thereby reducing likelihood of affecting error analysis and/or numerical stability. Some integrated circuit devices (e.g., FPGA) may implement hard floating-point (HFP) circuitry, such as a digital signal processing (DSP) block, distributed memories, and/or flexible internal connectivity, which can support the discussed high performance matrix arithmetic.

Figure 1:
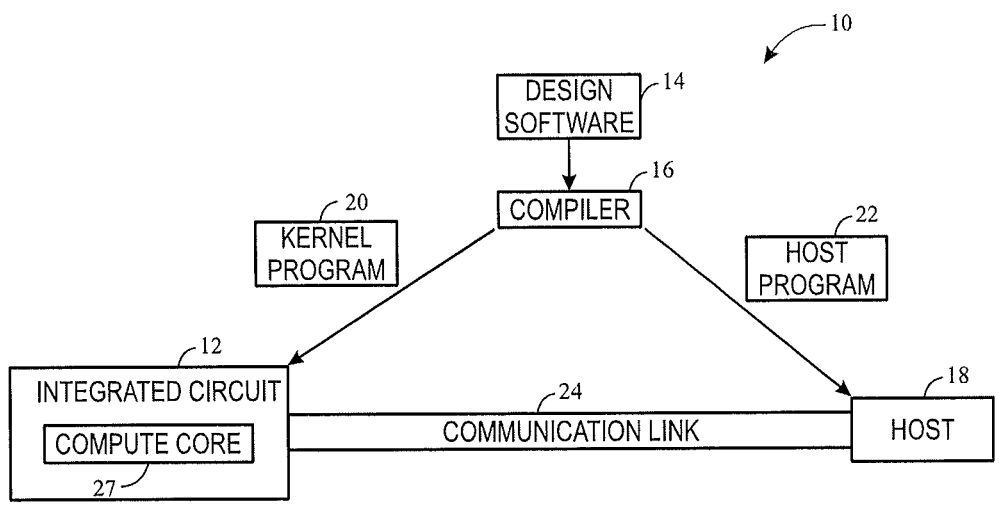
FIG. 1 is a block diagram of a system that utilizes adaptable logic to affect a machine-implemented program, in accordance with an embodiment.

With the foregoing in mind, FIG. 1 illustrates a block diagram of a system 10 that utilizes adaptable logic to affect a machine-implemented program. As discussed above, a designer may desire to implement QR decomposition on an integrated circuit 12 (IC, such as a field programmable gate array (FPGA)). In order to implement a set of programmable logic for the IC 12, in this case to handle QR decomposition, the designer may implement high level designs using design software 14, such as a version of Quartus by Intel™. The design software 14 may use a compiler 16 to convert the high level program into a low level program. The compiler 16 may provide machine-readable instructions representative of the high level program to a host 18 and the IC 12. For example, the IC 12 may receive one or more kernel programs 20 which describe the hardware implementations that should be stored in the IC. The host 18 may receive a host program 22 which may be implemented by the kernel programs 20. To implement the host program 22, the host 18 may communicate instructions from the host program 22 to the IC 12 via a communications link 24, which may be, for example, direct memory access (DMA) communications or peripheral component interconnect express (PCIe) communications. In some embodiments, the kernel programs 20 and the host 18 may enable dynamic adaptability, through adapted logic 26, which may be stored on the IC 16 and controlled by the host 18.

Figure 2:
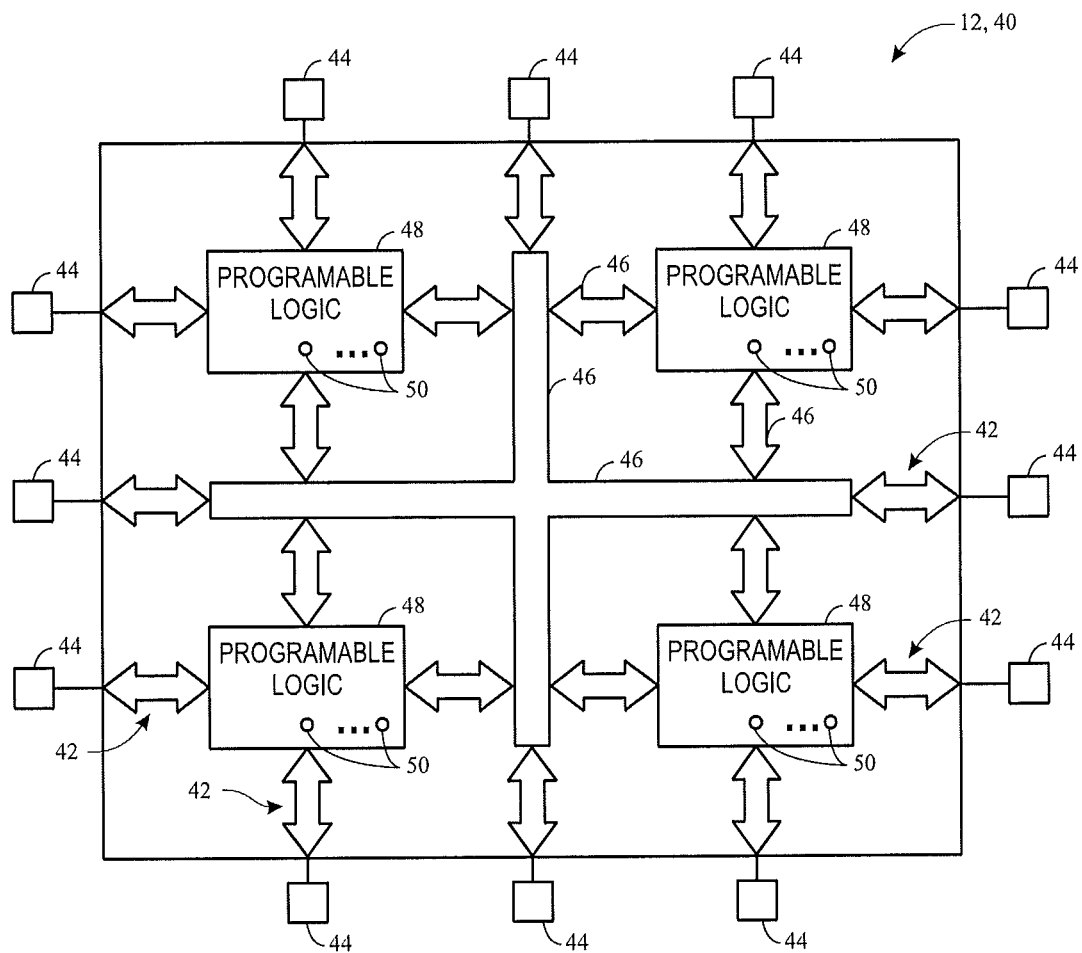
FIG. 2 is an integrated circuit device (e.g., FPGA), which may be configured to implement a Modified Gram-Schmidt (MGS) algorithm, in accordance with an embodiment.

Turning now to a more detailed discussion of the IC 12, FIG. 2 illustrates an IC device 12, which may be a programmable logic device, such as a field programmable gate array (FPGA) 40. For the purposes of this example, the device 40 is referred to as an FPGA, though it should be understood that the device may be any type of programmable logic device (e.g., an application-specific integrated circuit and/or application-specific standard product). As shown, FPGA 40 may have input/output circuitry 42 for driving signals off of device 40 and for receiving signals from other devices via input/output pins 44. Interconnection resources 46, such as global and local vertical and horizontal conductive lines and buses, may be used to route signals on device 40. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48.

Programmable logic devices, such as FPGA 40, may contain programmable elements 50 with the programmable logic 48. For example, as discussed above, a designer (e.g., a customer) may program (e.g., configure) the programmable logic 48 to perform one or more desired functions, such as QR decomposition. By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically-programmable read-only-memory technology, random-access memory cells, mask-programmed elements, and so forth.

The circuitry of FPGA 40 may be organized using any suitable architecture. As an example, the logic of FPGA 40 may be organized in a series of rows and columns of larger programmable logic regions, each of which may contain multiple smaller logic regions. The logic resources of FPGA 40 may be interconnected by interconnection resources 46 such as associated vertical and horizontal conductors. For example, in some embodiments, these conductors may include global conductive lines that span substantially all of FPGA 40, fractional lines such as half-lines or quarter lines that span part of device 40, staggered lines of a particular length (e.g., sufficient to interconnect several logic areas), smaller local lines, or any other suitable interconnection resource arrangement. Moreover, in further embodiments, the logic of FPGA 40 may be arranged in more levels or layers in which multiple large regions are interconnected to form still larger portions of logic. Still further, other device arrangements may use logic that is not arranged in a manner other than rows and columns.

Turning now to a more detailed discussion of the QR decomposition methods and implementation the above example of an FPGA 40 may utilize, the canonic Modified Gram-Schmidt (MGS) technique will be described below. Additionally, a technique for implementing parallel datapaths, which approaches 50% ratio of sustained performance to peak performance throughput by grouping of operations in a different manner, will be described, in accordance with an embodiment. Finally, a technique for implementing parallel datapaths, which trends towards 100% ratio of sustained performance to peak performance, will be introduced, in accordance with an embodiment. The grouping of the operations is again changed with little or no effect on the order of dependent operations.

The input matrix is A, a n×n-element square matrix formed out of the column vectors $a_k$, $k \in \{1 \ldots n\}$:

$$A = [a_1 | a_2 | \ldots | a_n]$$

The dot product $x^T y$ is denoted by $\langle x, y \rangle$ and the norm of the column vector x is denoted by |x| the norm of the column vector x. The L2-norm used in this article is:

$$|x| = |(x_1, \ldots, x_n)^T|$$
$$= \sqrt{x_1^2 + \ldots + x_n^2}$$

To help illustrate effects of realistic datapaths and operator latencies in an integrated circuit device 12, an example 256×256 is described. As used herein, a vector operation denotes a dot product and a scalar operation denotes a multiply-add or multiply-subtract.

Canonic MGS Algorithm

The canonic MGS algorithm is described in Algorithm 1 shown below.

---
Algorithm 1 Gram-Schmidt-based QR factorization 1  function QRD (A);
   Input :      Matrix A (square)
   Output:      Matrix Q (orthogonal) and R
                (upper-triangular)
2  for i=1:n do
3  |    $r_{i,i} = |a_i|$
4  |    $q_i = a_i / r_{i,i}$
5  |    for j=i+1:n do
6  |    |    $r_{i,j} = \langle q_i, a_j \rangle$
7  |    |    $a_j = a_j - r_{i,j} q_i$

---

There are n outer loop iterations $i \in \{1 \ldots n\}$. Returning to the 256×256 there are 256 outer loop iterations. At the beginning of each iteration ($k \in \{1 \ldots n\}$), the norm of the column vector $a_k$, is calculated. This can be computed as the dot product $\langle a_k, a_k \rangle$, followed by a square root. Both the dot product and the square root are long latency operations.

In an FPGA 40 with hard floating-point (HFP) cores, a 256-length dot product may utilize 25 or more cycles depending on the target frequency, with an additional 10 to 20 cycles for the square root. This creates a data dependency for the following function, which is another long latency operator, in this case a divide operation. A more efficient implementation is to replace the square root and division with an inverse square root and multiplication, which may still involve 20 cycles. In other words, about 45 cycles may be used to process the first column, before any of the other columns can start being processed.

The following columns $j \in \{i+1 \ldots n\}$ are processed by the inner loop. The first operation is a dot product, followed by a multiply-subtract operation. The dot product again has a relatively long latency, and creates a data dependency for the multiply-subtract operation. In contrast, the multiply-subtract operation has a relatively short latency, typically 5 clock cycles. Looking at the number of clock cycles used for a single iteration mid-algorithm (i=128), the normalization calculation may utilize around 45 cycles, and the 127 following inner loop iterations each utilize 30 cycles. Clearly, this is very inefficient, with the ratio of sustained performance to peak performance in the region of 3%, based on the amount of time stalled. However, the true cost can be much higher when the scalar and vector structures are on independent datapaths.

Improved MGS Algorithm

An improved MGS algorithm, which has been developed in order to reduce the effect of the dependencies, is shown in Algorithm 2 below.

---
Algorithm 2: QRD improved algorithm
---

1  functionQRD (A);
   Input:          Matrix A (square)
   Output:         Matrix Q (othogonal) and R
                   (upper-triangular)

2  for i = 1:n do

3  $\quad r_{i,i} = |a_i|$

4  $\quad$ for $j = i + 1$:n do

5  $\quad\quad r_{i,j} = \frac{\langle a_i, a_j \rangle}{\langle a_i, a_i \rangle}$ 6  $\quad q_i = a_i / r_{i,i}$ 7  $\quad$ for $j = i + 1$:n do 8  $\quad\quad a_j = a_j - r_{i,j} a_i$

---

Each of the $r_{i,j}$ values may be processed in a separate loop before the projection is applied to the column vectors (e.g., via the multiply-subtract operator). This largely eliminates the data dependency between the $r_{i,j}$ calculation and the multiply-subtract operator. However, it is noted that a data dependency may still exist between the last $r_{i,j}$ vector and the first multiply-subtract operation. Additionally, there may still be a data dependency between the normalization value and the first vector $q_i$ and between $q_i$ and the first $r_{i,j}$ value. This can also be optimized away.

Examining the multiply-add operation $a_j = a_j - r_{i,j} q_i$, the definitions of $r_{i,j}$ and $q_i$ may be substitute to make an equivalent calculation:

$$a_j = a_j - \frac{\langle a_i, a_j \rangle}{|a_i|} \frac{a_i}{|a_i|}$$

which can be simplified to:

$$a_j = a_j - \frac{\langle a_i, a_j \rangle}{\langle a_i, a_i \rangle} a_i$$

The loop of $r_{i,j}$ calculations now has no input data dependencies and, thus, can operate while the normalization calculation bubbles through the pipeline. Additionally, the inverse square root can be calculated in parallel with the division operation in the $r_{i,j}$ calculation. Once all of the vectors for the $r_{i,j}$ calculation have been read out, processing can begin, as long as at least one $r_{i,j}$ value has been calculated for that pass. The $r_{i,j}$ pipeline can continue to run while the multiply-subtract operation begins.

One remaining issue is that the vector calculation (e.g., r calculation and the normalization) may be implemented using different hardware than the multiply-subtract operation. Since each of the vectors for the r calculation have been read before the multiply-add operation begins, typically one structure may be idle while the other is being utilized. This is the case for both soft-logic and hard floating-point solutions in FPGAs. Traditionally, soft floating-point implementations have been resource intensive with very long latencies, but more efficient methods have been made available with the floating-point datapath compilers. Current FPGA single-precision hard floating-point DSP Blocks are now supported as well. Both the soft compiled datapath and the hard solution provide the vector functionality fixed at compile time. In other words, in some embodiments, the functionality may not be changed between vector and scalar mode during run time.

One method to mitigate this for HFP would be to have a dynamic digital signal processing (DSP) structure, which can be switched between vector and scalar processing. However, this approach may increase processing latency since the pipeline may be completely flushed before switching from vector to scalar mode. Similarly, a soft logic design could be constructed using individual floating-point adders, but it may result in a much longer pipeline flush time.

Although this form of the algorithm is a major improvement, the ratio of sustained performance to peak performance processing achieved may be about 50%, mainly because half of the datapath structures are idle at any given time. For a high-performance design, memory access (e.g., data transfer between the memories and the datapath cores) may be massively parallel. In this algorithm mapping, both the vector and scalar cores are connected to the same memories; although the fan-out of 2 itself is small, the net effect of 256 single or double precision buses—and potentially complex numbers—is a considerable strain on the routing resources of the device. Fan-out may limit timing closure in an FPGA 40. Therefore, our goal now is to find an improved algorithm, which utilizes all datapaths simultaneously, and also manages to reduce the fan out of large, wide buses.

Further Improved MGS Algorithm

By re-organizing the loops, the improved MGS algorithm may be implemented with a scalar datapath feeding a vector datapath, thereby enabling both datapaths to be utilized simultaneously and/or reducing fan-out of large, wide buses. This has the effect of making near 100% ratio of sustained performance to peak performance possible, as both datapaths are active at the same time; with an additional benefit of halving the fan-out of the memories. The memories connect directly to the scalar datapath, and the scalar datapath feeds the vector datapath in turn. The further improved MGS algorithm is shown in Algorithm below.

---
Algorithm 3: QRD Proposed QRD algorithm
---

1 function QRD (A);
   Input:      Matrix A (square)
   Output:   Matrix Q (othogonal) and R
               (upper-triangular)
2 $r_{1,1} = |a_1|$
3 for j = 2:n do
4 $\quad r_{1,j} = \dfrac{(a_1, a_j)}{(a_1, a_1)}$
5 for i = 1:n-1 do
6 $\quad q_i = a_i / r_{i,i}$
7 $\quad$ for j = i+1:n do
8 $\quad\quad a_j = a_j - r_{i,j} a_i$
9 $\quad\quad$ if j = i+1 then
10 $\quad\quad\quad r_{i+1,j} = |a_j|$
11 $\quad\quad$ else
12 $\quad\quad\quad r_{i+1,j} = \dfrac{(a_{i+1}, a_j)}{(a_{i+1}, a_{i+1})}$
13 $q_n = a_n / r_{n,n}$ In Algorithm 3, the first operation may still utilize the vector datapath, which is used to calculate the normalization and $r_{1,j}$ values for the first pass, using the optimizations of the improved MGS algorithm described previously. In other words, before the main loop, the vector structure may be used to calculate the normalization and $r_{1,j}$ values for the first pass, using the optimizations explained above. The scalar structure may be bypassed, e.g. by muxing, or data may be passed through by zeroing the other inputs.

The main loop calculates $q_i$ and all of the multiply-subtract values, and writes these back to memory. At the same time, the $r_{i,j}$ values for the next loop iteration are calculated from the $a_j$ vector written back to memory; the multiply-subtract datapath, feeds both the memory write port, as well as the vector datapath, so that scalar and vector datapaths are utilized at the same time. The fan-out of two has been moved from the output of the memory to the output of the scalar datapath. This is a much less severe restriction on fitting than the earlier case, and will be explored further in the following architecture section. The first r in each loop iteration is the normalization value, and is calculated by the inverse square root of the dot product of the first a vector written back, but this is handled with the same complexity of operators and logic as for the known case. Again, this will be described in greater detail in the following section. The q vector, which is the first output of each loop, is also calculated using the scalar datapath; for this case the input to the subtractor is zeroed.

The pre-loop values are also calculated with the chained scalar and vector datapaths. The scalar datapath is bypassed, by latching one of the multiplier inputs to zero. Therefore one datapath structure may be implemented, thereby reducing routing stress, removing a need for a multiplexer, and/or simplifying the control logic.

The final pass include a single vector division, which is again handled by the scalar structure. Like the q calculations of the previous columns, the subtractor input is zeroed.

Architectural Implementation

Figure 3:
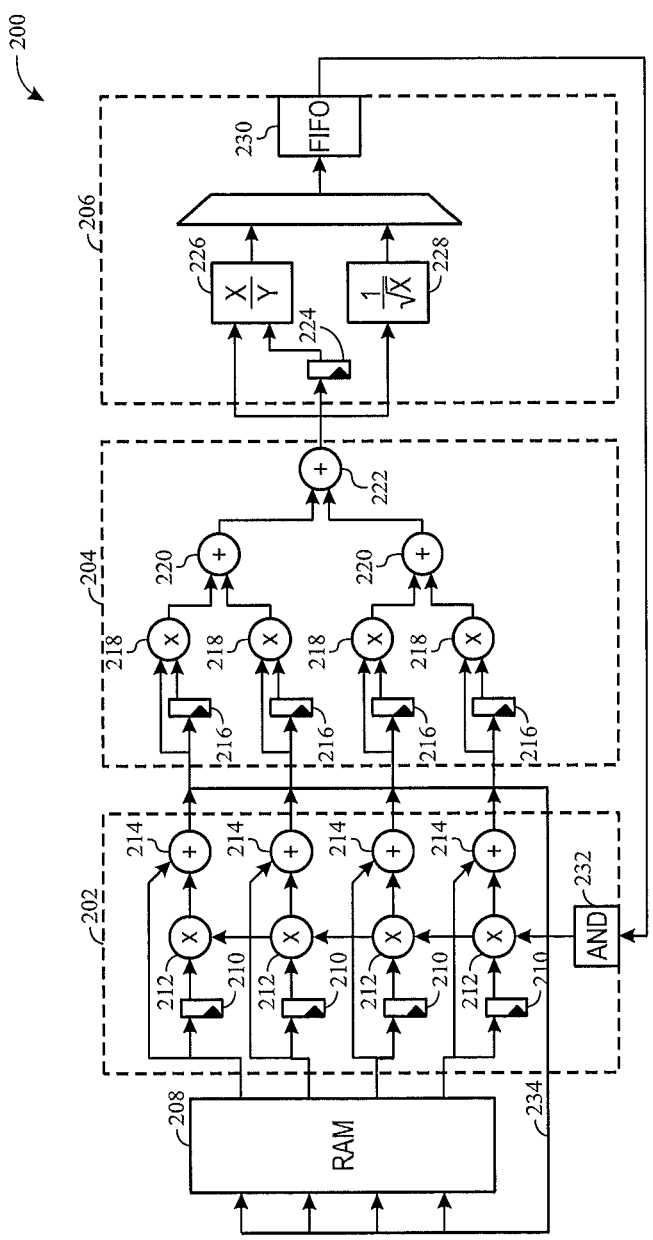
FIG. 3 is a schematic diagram illustrating hardware for implementing a Modified Gram-Schmidt (MGS) algorithm, in accordance with an embodiment.

FIG. 3 illustrates a hardware structure for implementing the new MGS algorithm 200, in accordance with an embodiment. RAM 208 contains the matrix to be processed. Additionally, in some embodiments, the RAM block 208 may include one memory per column, so that the entire column can be accessed in parallel. Additional logic and control may be implemented to load and unload the matrix, but this is not shown as it can be implemented in many ways by a skilled person.

The first column in an iteration, $a_i$, may be latched 210 at the input of the multipliers 212. The other input of the multipliers 212 may be a common input from the elementary functions 206, either the inverse square root 228, for the normalization of the vector (the subtractor is zeroed in this case), or the divider 226, to apply the projection of the first vector onto the rest. A FIFO 230, or other delay mechanism, is provided to align the output of the elementary functions 206 (which are generated for the previous iteration) with the vectors $a_j$ for the current iteration. The new $a_j$ may then be written back to the RAM block 208 (e.g., via busses 234), and, at the same time, may be outputted as an input to the vector datapath 204.

The vector datapath 204 latches the first vector it receives for an iteration, which is the normalized $a_i$, or normalized vector, at latch 216, and calculates an inner product of $<a_i, a_j>$. The inner product is latched 224 at the input of the divider 226, and is also used at the input of the inverse square root function 228, to generate the normalization value for the next iteration. The following vector outputs, the inner products of $<a_i, a_j>$, are divided (e.g., using the divider 226) by the latched value 224, to calculate the angle between the first and following vectors for the next pass.

In other words, each loop may have the same data flow, first through the scalar datapath 202, and then through the vector datapath 204, then through the elementary functions 206. During the first pass, the AND gate 232 effectively makes the scalar datapath 202 perform no operations, with only the vector datapath 204 and elementary functions 206 doing work. Data is also not written back to RAM 208.

The main loop starts as soon as the last data for the first pass has been read, and the first data has been written to the FIFO 230. The first vector is latched in registers 210, which is multiplied by the output of FIFO 230 (AND gate 232 now passes this value), and added (e.g., via adders 214) to each subsequent vector. The result is written back via busses 234 to RAM 208. The same results are immediately processed by the vector datapath 204 (the first vector out is latched 216), the outputs of which are handled by inverse square root block 228 and divider block 226. Once the last vector has been read from the busses, and at least one value has been written to FIFO 230, processing of the next loop can be started.

From FIG. 3, it can be seen that, in some embodiments, virtually all of the functionality is mapped to HFP blocks (where available for single precision), with only a small amount of soft logic being used in the core for muxing, latching, and to support the implementations of the elementary functions. The counting and decoding logic in the controller may be a trivial part of the cost of the QR decomposition core.

Though FIG. 3 illustrates a fully parallel implementation, with associated performance analysis and results that are based on a fully parallel implementation, in certain embodiments the hardware structure design may be adapted to a multi-cycle version. For example, a smaller vector and scalar core (e.g., 64 elements) may be accumulated over multiple (e.g., 4) cycles to save resources. The number of parallel RAM blocks would still be equal to the parallelism of the datapath units, but the RAMs would be deeper, with the columns accessed over multiple clocks. There would be no difference to the structure of the scalar datapath, although the vector datapath would accumulate results over multiple clock cycles. The divider and inverse square root dataflow would also be unaffected, with the main difference reflected in a more complex controller.

Performance Analysis

Turning now to a discussion of performance analysis of the embodied implementations of the new MGS algorithm, the current section provides an estimate of the expected ratio of sustained performance to peak performance of the new MGS algorithm, assuming real-world implementations. Although the theoretical ratio of sustained performance to peak performance is close to 100%, pipelining may reduce this by introducing stalls, as well as a smaller component of initial pipeline fill. The larger the matrix, the lower the incidence of stalling. Using HFP, rather than soft logic datapaths, may also reduce the amount of stalling because of the lower latencies associated with the embedded components.

Although generally an $n^3$ cycle process, the disclosed techniques may enable QR decomposition in $n^2$ cycles since an entire column vector may be read per clock cycle. For an n×n matrix, there may be n iterations, with the number of columns processed per iteration decreasing by 1 each pass. Ignoring pipelining, QRD therefore takes $\frac{1}{2}(n^2)$ cycles.

The roundtrip through the multiply-subtract core, which includes the registered memory interfaces, the four or five pipeline stages of the multiply-subtract core, and a small number of additional registers, such as the multiplier input latch, and the registered multiplexer (to provide external read and write access to the RAM) on the input of the memory, may be relatively short. Additional pipeline may be used for fitting purposes. In some embodiments, breaking up long paths for the many floating-point datapaths can improve the timing closure of complex designs. Typically, the total delay in the multiply-subtract path may be less than 10 cycles. The scalar roundtrip path may have minimal impact on system performance, which may be dominated by the vector and elementary function depth instead, and may include the scalar outbound (to the output of the subtractor). Before the next iteration can be started, the angle between the previously calculated vector and the current vectors may be made available. This may be the sum of the scalar outbound depth, the vector depth, and the division operator, along with the various hold latches and pipelines added for fitting. The scalar outbound depth is close to the scalar roundtrip path, perhaps 8 cycles. The vector depth is dependent on the vector size, and in current devices is several times the scalar path:

$$vectorDepth = 8 + (4 + 3[\log_2(n)]) + 15 + x.$$

The divider has a latency of about 15 cycles, n is the column height of the matrix, and x represents the additional pipeline depth, which is generally small. For our 256×256 example, the vector depth would be in the order of 55 cycles. If the number of columns in the iteration is greater than the vector depth, then this latency would be hidden in the processing time of the iteration, as the result of the vector pipeline may not be used until the iteration is complete. The QR decomposition implementation would therefore utilize approximately the following number of cycles:

$$t_{QRD} = \sum_{i=1}^{n} \max(i, vectorDepth)$$

For our 256×256 example this is in the order of 34,025 cycles, compared to the untimed maximum of 32,768, for a ratio of sustained performance to peak performance of 96%. The amount of time for the pre-main loop calculation, which only uses the vector datapath, is included here as the nth sum; although the scalar datapath is not used for this first pass through the core, the data still flows through it.

As the longer latency of the combined vector datapath and elementary functions may place a floor on the number of cycles per iteration, using a multicycle architecture for smaller matrix sizes may have a negligible impact on performance, with a significant resource reduction. For example, a 64×64 QRD may have a floor of about 53 cycles per iteration; if a 4 cycle datapath is used, the latency may drop by another 2 cycles because of the smaller vector size, but increase by 3 cycles for the accumulation of the vector components, assuming HFP accumulation. In other words, vector depth, and therefore the floor of cycles per iteration, may vary over a small amount with different vector sizes and multi-cycle options.

The multi-cycle QRD latency is modified by the value m, which we define as the number of cycles per column. For our 64×64 example, with a 16 element datapath (m=4), the number of cycles is 8570, compared to 3570 cycles for the fully parallel implementation. In this case, the latency is increased by 2.4×, but the number of resources is almost reduced to 0.25×.

Results

In some embodiments, the disclosed techniques may be implemented in a core generator written in a programming language, such as C++. The generator takes as input the matrix dimension (n), the custom floating-point format defined by (wE,wF), the target FPGA and objective frequency. Additionally, the compute cores of the disclosed techniques, size-n dot product, multiply-add, division, and inverse square-root, may be generated using a DSP builder, which supports multiple FPGA devices and frequency driven pipelining.

Table I presents the latencies of these compute cores when in an example integrated circuit device, with an objective frequency set to 400 MHz, for single-precision (wE=8, wF=32).

TABLE I

Latency of the QRD components for various configurations

| n, v | Type | Latency | | | |
|---|---|---|---|---|---|
| | | div | rsqrt | scalar | vector |
| 64, 64 | real | 17 | 11 | 4 | 26 |
| 128, 128 | real | 17 | 11 | 4 | 30 |
| 256, 256 | real | 17 | 11 | 4 | 34 |
| 384, 384 | real | 17 | 11 | 4 | 34 |
| 512, 512 | real | 17 | 11 | 4 | 38 |

With an increase in n, the vector latency increases roughly at 2+4 log 2(n). As it can be observed, as n increases from 128 to 512 the latency increases by only 8 cycles for a fully pipelined implementation.

The synthesis results for this architecture are presented in Table II.

TABLE II

Synthesis results for various size QRD designs

| n, v | Type | Freq. | ALMs | DSPs | M20K |
|---|---|---|---|---|---|
| ours 64, 64 | real | 461 MHz | 4808 | 135 | 72 |
| 128, 128 | real | 445 MHz | 11207 | 265 | 136 |
| 256, 256 | real | 430 MHz | 22013 | 526 | 264 | real and imaginary components may be assembled using an adder 308 and a subtractor 306. One subtlety is that the dot product <x,y> may utilize a conjugate transpose of x.

The architectures described in Table II may include extra stages of pipeline on the control and other high-fan-out signals. With an increase in n, the physical distance between the placement of the control FSM and the controlled structures may also increase. Thus, a variable number of pipeline stages may be added (depending on n) on these control signals. The output of the FIFO 230 also feeds n multiply-add blocks (e.g., operators) and, therefore, utilize appropriate pipelining. The extra delays are accounted for at FSM generation time. The synthesis results confirm that the pipelining strategy is effective for obtaining high frequency, chip-filling designs.

Table III shows how the ratio of sustained performance to peak performance improves with increasing matrix size.

TABLE III

Sustained-to-peak and absolute performance for various matrix sizes

| | n, v | Datapath latency | Peak Latency | Real Latency | Ratio | Perf. (GFlops) | μs |
|---|---|---|---|---|---|---|---|
| | | | Real | | | | |
| ours | 64, 64 | 51 | 2080 | 3355 | 61% | 71.7 | 7.27 |
| | 128, 128 | 55 | 8256 | 9741 | 84% | 190.9 | 21.8 |
| | 256, 256 | 59 | 32896 | 34607 | 95% | 417.8 | 80.4 |
| | 384, 385 | 60 | 73920 | 75690 | 97% | 577.6 | 195 |
| | 512, 512 | 65 | 131328 | 133408 | 98% | 744.2 | 359.5 |
| | | | Complex | | | | |
| ours | 32, 32 | 51 | 528 | 1888 | 27% | 62.6 | 4.1 |
| theirs | 32, 8 | — | — | | | 13.9 | 19.4 |
| theirs | 32, 16 | — | — | | | 17.6 | 15.3 |
| ours | 64, 64 | 56 | 2080 | 3620 | 57% | 237 | 8.8 |
| theirs | 64, 8 | — | — | | | 20.2 | 105 |
| theirs | 64, 16 | — | — | | | 33.8 | 62.9 |
| ours | 128, 128 | 61 | 8256 | 10086 | 81% | 606.5 | 27.5 |

TABLE II-continued

Synthesis results for various size QRD designs

| n, v | Type | Freq. | ALMs | DSPs | M20K |
|---|---|---|---|---|---|
| 384, 384 | real | 388 MHz | 32726 | 787 | 392 |
| 512, 512 | real | 371 MHz | 43404 | 1047 | 520 |
| ours 32, 32 | complex | 455 MHz | 7814 | 270 | 76 |
| ours 64, 64 | complex | 407 MHz | 14826 | 530 | 139 |
| ours 128, 128 | complex | 366 MHz | 28865 | 1050 | 267 |

The top part of the table presents synthesis results for a QRD operating only on real numbers, whereas the bottom part of the table presents results for the QRD operating on complex numbers. In the case of the Complex QRD, the multiply-add operation becomes a complex multiply-add core, which may be implemented as follows.

$$AB+C=(a_{re}+i\cdot a_{im})(b_{re}+i\cdot b_{im})+(c_{re}+i\cdot c_{im})=(a_{re}b_{re}-a_{im}b_{im}+c_{re})+i\cdot(a_{re}b_{im}+a_{im}b_{re}+c_{im})=(a_{re}b_{re}-(a_{im}b_{im}-c_{re}))+i\cdot(a_{re}b_{im}+(a_{im}b_{re}+c_{im}))$$

Figure 4:
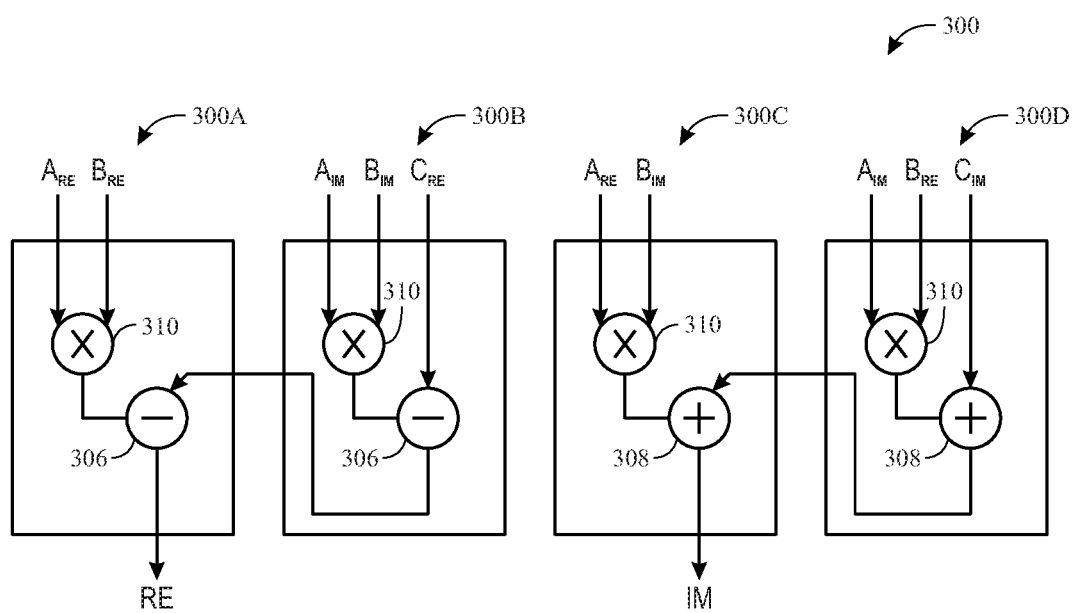
FIG. 4 is a schematic diagram illustrating a complex multiply-add core implemented using 4 processing blocks, in accordance with an embodiment.

By regrouping the mapping to the HFP structures, the complex multiply-add core may be implemented using 4 processing blocks (300A, 300B, 300C, and 300D), as depicted in FIG. 4.

In particular, the complex dot product may be split element-wise into 4 real dot products 310 of size n. The final The disclosed techniques achieve over a 95% ratio of sustained performance to peak performance for n=256, and increases to over 98% for n=512. The performance in GFlops is reported using the frequency numbers from Table II. It can be seen that the disclosed techniques achieve over 744 GFlops while utilizing only 1047 DSPs, for example, out of the 1687 DSPs available in the example integrated circuit device 12, or about 62% of the DSPs. The logic utilization is 43404 ALMs out of 251680 ALMs, which is only 17%. Having a comfortable margin on logic utilization, in some embodiments, the disclosed techniques may provide a 10-20% frequency improvement for a 10% logic increase.

In other QR decomposition techniques, vector width may always be smaller than the matrix size and, therefore, is expected to consume fewer resources and have a longer latency compared to the disclosed techniques. This holds true for DSPs and memory blocks, but the disclosed techniques consumes 3.7 to 5.7 times fewer ALMs for n=32 and 2.4 to 3.4 times fewer ALMs for n=64. The algorithmic improvements are also observed when analyzing latency. For n=64 the disclosed techniques takes 8.8 μs (v=64) and is expected to take 21.55 μs (v=16). In comparison, the latency reported in other QR decomposition techniques for n=64, v=16 is 62 μs. This proves that, for the same hardware resources, the disclosed techniques are 3 times faster.

In some embodiments, the present invention to perform QR decomposition of a matrix may be used in hard-wired applications. It may also have use in software implementations, especially involving multi-core processors, which may be affected by data dependencies across several of the processor cores. Additionally/alternatively, the circuitry and methods discussed may be used in programmable integrated circuit devices 12, which may allow users to configure a programmable device in order to perform matrix operations by providing programming software to do so. As a result of this embodiment, fewer logic resources of the programmable device may be consumed.

The calculations involved in the QR decomposition discussed above may be solved using fixed-point or floating-point calculations. With floating point calculations, a programmable device may be configured to use the methods described. To do so, a machine-readable medium may be encoded with instructions to program a programmable device (e.g., an FPGA) to perform the QR decomposition methods that were discussed. These instructions may be executed by a suitable computer or device that is equipped to interface with and program a programmable device.

Figure 5:
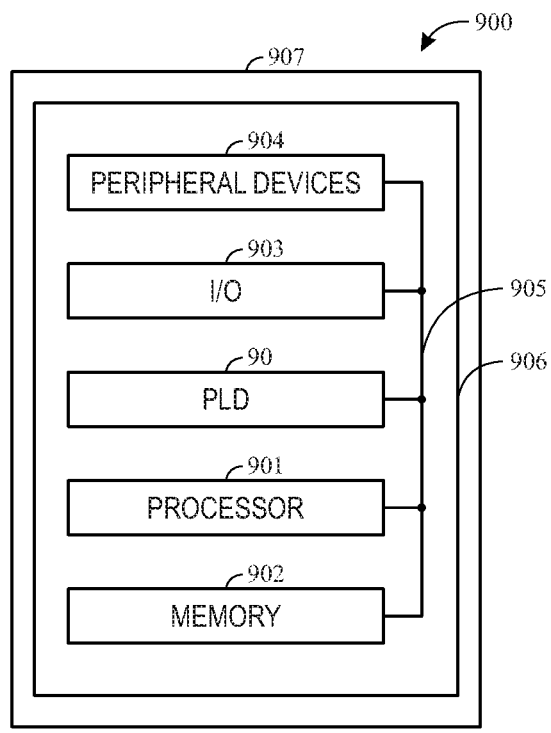
FIG. 5 is a data processing system, in accordance with an embodiment.

FIG. 5 displays a data processing system 900, which may be an example of one of the many electronic devices a programmable logic device may be used in. The data processing system 900 may include a processor 901, memory 902, I/O circuitry 903, peripheral devices 904, and/or additional or fewer components. The components in data processing system 900 may be coupled together by a system bus 905 and populated on a circuit board 906, which may be contained in an end-user system 907.

Data processing system 900 may be used in an array of applications. For example, it may be used in computer or data networking, instrumentation, video or digital signal processing, or in other applications that may find programmable logic advantageous. The programmable logic device 90 may be used within the system 900 to perform logic functions. PLD 90 may be configured as a processor or controller that may cooperate with processor 901, PLD 90 may be used as an arbiter to arbitrate access to a shared resource and/or resources in system 900, or it may interface between processor 901 and other components in the system 900, among other examples.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The invention claimed is:

1. An integrated circuit device, comprising:
a memory device communicatively coupled to circuitry, wherein:
the memory device stores an input matrix, having dimensions of size-n;
the circuitry comprises:
a multiply-add datapath communicatively coupled to an output of the memory device;
a dot product datapath communicatively coupled to an output of the multiply-add datapath, via a feed-forward coupling; and
one or more elementary function blocks communicatively coupled to an output of the dot product datapath; and
the circuitry comprises a hardware arrangement that utilizes both the multiply-add datapath and the dot product datapath at the same time to process the input matrix.

2. The integrated circuit device of claim 1, comprising:
circuitry implemented to receive the input matrix;
circuitry implemented to perform a QR decomposition of the input matrix; and
circuitry implemented to provide a result of the QR decomposition.

3. The integrated circuit device of claim 2, wherein:
a Q matrix and an R matrix are calculated at the same time; and
wherein only the Q matrix is stored.

4. The integrated circuit of claim 2, wherein the integrated circuit comprises:
one or more compute cores that utilize the QR decomposition.

5. The integrated circuit of claim 4, wherein the one or more compute cores comprise:
a size-n dot product compute core, a size-n multiply-add compute core, a division compute core, an inverse square-root compute core, or any combination thereof.

6. The integrated circuit of claim 4, wherein the one or more compute cores comprise: a size-m dot product compute core, a size-m multiply-add compute core, a division compute core, an inverse square-root compute core, or any combination thereof;
wherein the size-m cores are a smaller dimension than the size-n, and multiple cycles are required to process one iteration of a vector.

7. The integrated circuit device of claim 1, comprising:
a first feedback path communicatively from a node between the multiply-add datapath and the dot product datapath to an input of the memory device; and
a second feedback path communicatively coupled from an output of the one or more elementary function blocks to a first input of the multiply-add datapath.

8. The integrated circuit device of claim 7, wherein:
data from the output of the multiply-add datapath is written to the input of the memory device and an input of the dot product datapath simultaneously.

9. The integrated circuit device of claim 8, wherein:
circuitry between the output of the one or more elementary function blocks and a second input of the multiply-add datapath delays data output from the one or more elementary function blocks by a variable number of clock cycles.

10. The integrated circuit device of claim 9, wherein:
the multiply-add datapath may be bypassed and data sent directly to the dot product datapath by zeroing the second input of the multiply-add datapath, and writing the data to the first input of the multiply-add datapath.

11. A tangible, non-transitory, machine-readable medium, comprising machine-readable instructions that, when executed by one or more processors, cause the processors to:
generate one or more compute cores of a programmable integrated circuit, wherein the one or more compute cores are coupled to a memory device which stores an input matrix, having dimensions of size-n, wherein the one or more compute cores utilize a multiply-add datapath communicatively coupled to an output of the memory device, a dot product datapath communicatively coupled to an output of the multiply-add datapath, and one or more elementary function blocks communicatively coupled to an output of the dot product datapath in order to perform a QR decomposition of the input matrix to obtain computational results, wherein the multiply-add datapath and the dot product datapath are used at the same time to perform the QR decomposition of the input matrix; and provide the one or more compute cores for implementation on the programmable integrated circuit.

12. The machine-readable medium of claim 11, wherein the programmable integrated circuit comprises a field programmable gate array.

13. The machine-readable medium of claim 11, wherein the one or more compute cores comprise:

a size-n dot product compute core, a size-n multiply-add compute core, a division compute core, an inverse square-root compute core, or any combination thereof.

14. The machine-readable medium of claim 11, wherein the one or more compute cores comprise: a size-m dot product compute core, a size-m multiply-add compute core, a division compute core, an inverse square-root compute core, or any combination thereof;

wherein the size-m cores are a smaller dimension than the size-n, and multiple cycles are required to process one iteration of a vector.

15. A hardware implemented method, comprising:

storing an input matrix in a memory device;

communicatively coupling a multiply-add datapath to an output of the memory device;

communicatively coupling a dot product datapath to an output of the multiply-add data path;

communicatively coupling one or more elementary function blocks to an output of the dot product datapath; and performing a QR decomposition of the input matrix to obtain computational results, using the multiply-add datapath, the dot product datapath, and the one or more elementary function blocks, wherein the multiply-add datapath and the dot product datapath are used at the same time to perform the QR decomposition of the input matrix.

16. The hardware implemented method of claim 15, comprising:

writing data from the output of the multiply-add datapath to an input of the memory device and an input of the dot product datapath simultaneously.

17. The hardware implemented method of claim 16, comprising:

delaying the data by a variable number of clock cycles between an output of the one or more elementary function blocks and an input of the multiply-add datapath.

18. The hardware implemented method of claim 15, comprising:

bypassing the multiply-add datapath and sending data directly to the dot product datapath by zeroing a first input of the multiply-add datapath, and writing the data to a second input of the multiply-add datapath.

19. The hardware implemented method of claim 15, comprising:

calculating a Q matrix and an R matrix at the same time; and wherein only the Q matrix is stored.

20. The hardware implemented method of claim 15, comprising:

utilizing the QR decomposition via one or more compute cores.

* * * * *